(12) United States Patent
Barner

(10) Patent No.: US 9,059,836 B2
(45) Date of Patent: *Jun. 16, 2015

(54) WORD BOUNDARY LOCK

(71) Applicant: Cavium, Inc., San Jose, CA (US)

(72) Inventor: Craig Barner, Shrewsbury, MA (US)

(73) Assignee: Cavium, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/492,557

(22) Filed: Sep. 22, 2014

(65) Prior Publication Data

US 2015/0016574 A1    Jan. 15, 2015

Related U.S. Application Data

(63) Continuation of application No. 13/281,052, filed on Oct. 25, 2011, now Pat. No. 8,855,248.

(51) Int. Cl.
| | |
|---|---|
| *H03K 5/19* | (2006.01) |
| *H04L 1/00* | (2006.01) |
| *H04B 1/16* | (2006.01) |
| *H03K 19/20* | (2006.01) |
| *H04L 25/49* | (2006.01) |
| *H04L 7/00* | (2006.01) |

(52) U.S. Cl.
CPC ............... *H04L 1/0091* (2013.01); *H04B 1/16* (2013.01); *H03K 19/20* (2013.01); *H03K 5/19* (2013.01); *G06F 2207/025* (2013.01); *H04L 7/0066* (2013.01); *H04L 25/4908* (2013.01)

(58) Field of Classification Search
CPC . G06F 7/02; G06F 2207/00; G06F 2207/025; G06F 13/4204; G01R 31/3177; H03K 5/19; H03K 5/22; H03K 19/20; H03M 9/00

USPC ............. 375/316, 340, 342; 326/52, 104; 714/727; 341/100
See application file for complete search history.

(56) References Cited

U.S. PATENT DOCUMENTS

| | | |
|---|---|---|
| 4,754,457 A | 6/1988 | Bright et al. |
| 5,099,497 A | 3/1992 | Ohno et al. |
| 5,299,236 A | 3/1994 | Pandula |

(Continued)

OTHER PUBLICATIONS

"Interlaken Protocol Definition—A Joint Specification of Cortina Systems and Cisco Systems," Revision 1.2, Cortina Systems Inc. and Cisco Systems, Inc., 2006-2008, pp. 1-52, Oct. 7, 2008.*

(Continued)

*Primary Examiner* — Jean B Corrielus
(74) *Attorney, Agent, or Firm* — Hamilton, Brook, Smith & Reynolds, P.C.

(57) ABSTRACT

In an embodiment, a method for determining a word boundary in an incoming data stream includes initializing an N bit register with initial content, receiving a number of consecutive N bit words of the incoming data stream and processing each of the number of consecutive N bit words. The processing includes performing operations per bit position of the register, including performing an XOR operation on a corresponding received data bit and a next received data bit, performing an AND operation on a current state of the bit position of the register and a result of the XOR operation, and storing a result of the AND operation to update the state of the bit position of the register. The word boundary is defined based on the content of the register following the processing of the number of consecutive N bit words.

25 Claims, 7 Drawing Sheets

(56) References Cited

U.S. PATENT DOCUMENTS

| | | | |
|---|---|---|---|
| 6,026,350 A * | 2/2000 | Tustin et al. | 702/73 |
| 6,055,619 A * | 4/2000 | North et al. | 712/36 |
| 6,232,895 B1 * | 5/2001 | Djupsjobacka et al. | 341/100 |
| 7,046,174 B1 * | 5/2006 | Lui et al. | 341/101 |
| 7,782,805 B1 * | 8/2010 | Belhadj et al. | 370/300 |
| 8,254,291 B2 * | 8/2012 | Ahn et al. | 370/254 |
| 8,270,433 B2 * | 9/2012 | Jiang | 370/466 |
| 8,332,729 B2 * | 12/2012 | Sivaramakrishnan et al. | 714/776 |
| 8,340,005 B1 * | 12/2012 | Belhadj et al. | 370/300 |
| 8,718,069 B2 * | 5/2014 | Hashimoto | 370/395.51 |
| 8,855,248 B2 | 10/2014 | Barner | |
| 2003/0190922 A1 | 10/2003 | Dalvi et al. | |
| 2005/0036618 A1 * | 2/2005 | Gammel et al. | 380/255 |
| 2006/0192700 A1 * | 8/2006 | Hori | 341/100 |
| 2009/0024883 A1 * | 1/2009 | Bethard | 714/708 |
| 2009/0224801 A1 * | 9/2009 | Lewin | 326/52 |
| 2009/0313526 A1 * | 12/2009 | Neuman | 714/758 |
| 2010/0260298 A1 | 10/2010 | Zinser | |
| 2011/0219208 A1 | 9/2011 | Asaad et al. | |
| 2011/0296282 A1 * | 12/2011 | Liu et al. | 714/785 |
| 2013/0019084 A1 * | 1/2013 | Orchard et al. | 712/222 |
| 2013/0101076 A1 * | 4/2013 | Barner | 375/368 |
| 2013/0104012 A1 * | 4/2013 | Barner | 714/807 |

OTHER PUBLICATIONS

Press Release, "Cavium Networks Unveils OCTEON II CN68XX—Industry's Highest-Performance Multi-Core Processors for Energy-Efficient Data Center, Mobile Internet and the Borderless Enterprise," 3 pgs., May 11, 2010.*

* cited by examiner

WORD BOUNDARY LOCK

RELATED APPLICATION

This application is a continuation of U.S. application Ser. No. 13/281,052, filed Oct. 25, 2011, now U.S. Pat. No. 8,855, 248, issued on Oct. 7, 2014. The entire teachings of the above application are incorporated herein by reference.

BACKGROUND

SerDes (serializer/deserializer) devices allow the transmission of data over a single differential pair instead of a parallel bus. A SerDes transmitter takes a parallel set of data bits (i.e., a data word) and converts it to a serial stream of bits for transmission over a single differential pair. The SerDes receiver reconstructs the data word from the received serial bit stream. In order to reconstruct the data word, the receiver needs to find the first bit of the word. This is referred to as a boundary word lock problem.

In data networking and transmission, there exist block synchronization 64B/66B and 64B/67B line codes that transform 64-bit data to 66-bit and 67-bit line codes, respectively, to achieve DC-balance and bounded disparity, and yet provide enough state changes to allow reasonable clock recovery. The receiver searches the incoming data stream for the 2-bit (64B/66B) or 3-bit (64B/67B) header for each 64 bit block.

Obtaining word boundary lock requires hardware to examine the data transitions received on a serial data line. The boundary of all words is marked by a 01 or 10 transition. However, not every transition marks the boundary of a word. The typical method for isolating the word boundary transitions requires the receiver to find a transition, advance N bits (N=66 or 67), and then check for another transition. If a transition is again found, the receiver continues to advance N bits and check for a transition until 64 consecutive transitions are found. If a transition is not found, the receiver must start over. This method relies on trial and error. Therefore, it can take a long and variable time to correctly identify the transition that marks a word boundary.

SUMMARY

In one aspect, a method for determining a word boundary in an incoming data stream includes initializing an N bit register with initial content, receiving a number of consecutive N bit words of the incoming data stream and processing each of the number of consecutive N bit words. The processing includes performing operations per bit position of the register, including performing an XOR operation on a corresponding received data bit and a next received data bit, performing an AND operation on a current state of the bit position of the register and a result of the XOR operation, and storing a result of the AND operation to update the state of the bit position of the register. The word boundary is defined based on the content of the register following the processing of the number of consecutive N bit words.

The content of the register following the processing of the number of consecutive N bit words indicates at least one bit set in the register represents the word boundary. In one embodiment, the number of consecutive N bit words is 64 words and N equals 67. In another embodiment, the number of consecutive N bit words is 64 words and N equals 66.

In an embodiment, the number of consecutive N bit words is that number at which exactly one bit is set in the register.

The content of the register may be replaced with subsequently received data following the defining of the word boundary.

The method may be performed in parallel on each lane of plural lanes of an Interlaken Protocol-based interface.

In another aspect, a receiver includes an N bit register initialized with initial content, and a logic circuit coupled to the register for processing each of a number of consecutive N bit words of an incoming data stream by performing operations per bit position of the register. The logic circuit includes XOR circuitry for performing an XOR operation on a corresponding received data bit and a next received data bit and AND circuitry for performing an AND operation on a current state of the bit position of the register and a result of the XOR operation. A result of the AND operation is used to update the state of the bit position of the register. The receiver is configured to define a word boundary in the incoming data stream based on the content of the register following the processing of the number of consecutive N bit words.

According to yet another aspect, a receiver includes plural lane circuits, with each lane circuit having an N bit register initialized with initial content, and a logic circuit coupled to the register for processing each of a number of consecutive N bit words of an incoming data stream by performing operations per bit position of the register. Each logic circuit includes XOR circuitry for performing an XOR operation on a corresponding received data bit and a next received data bit, and AND circuitry for performing an AND operation on a current state of the bit position of the register and a result of the XOR operation, a result of the AND operation updating the state of the bit position of the register. For each lane circuit, the receiver is configured to define a word boundary in the corresponding incoming data stream based on the content of the corresponding register following the processing of the number of consecutive N bit words.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Before describing example embodiments of the present invention in detail, an example network security processor in which the embodiments may be implemented is described immediately below to help the reader understand the inventive features of the present invention.

Figure 1:
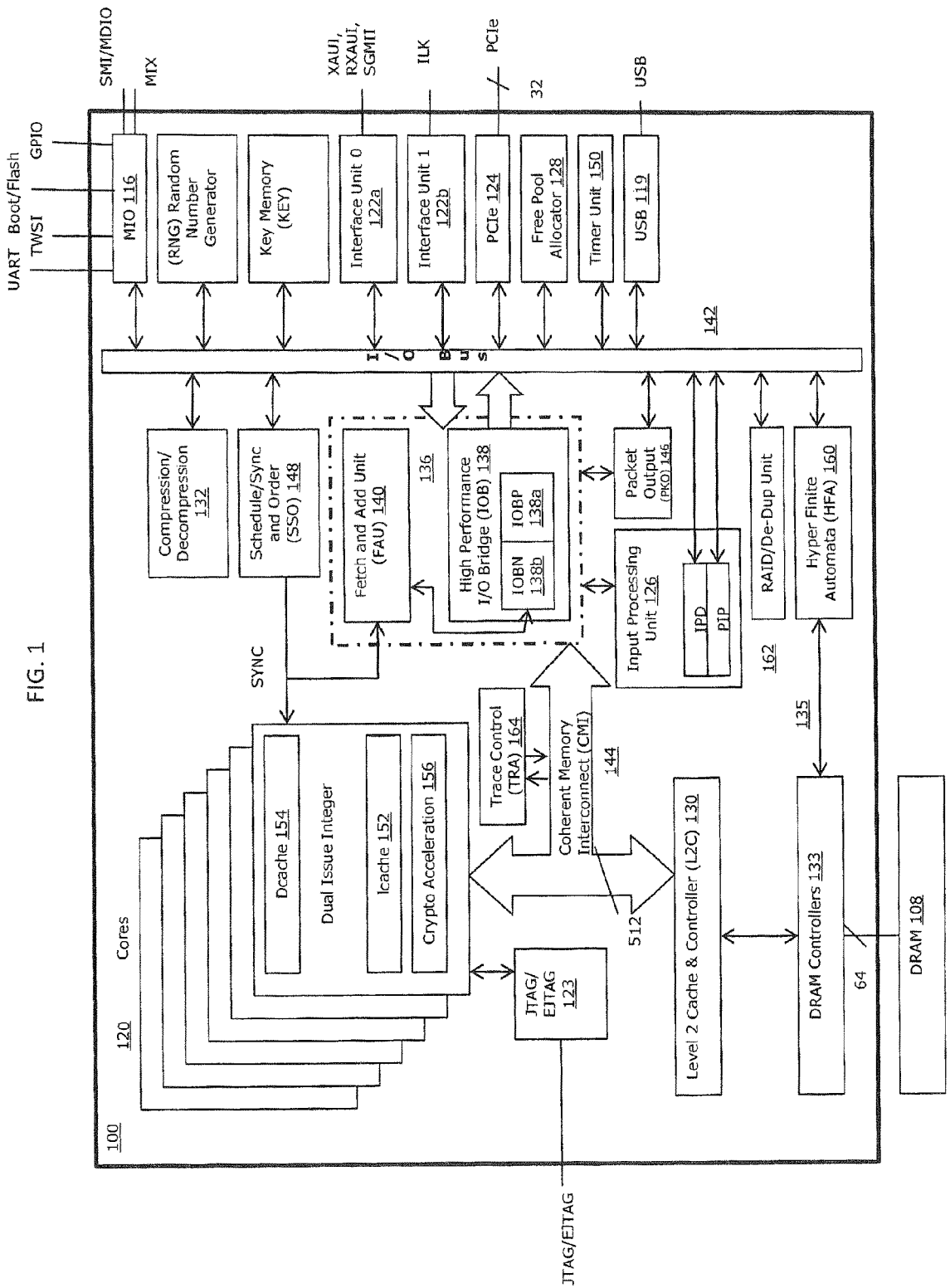
FIG. 1 is a block diagram of an example network services processor.

FIG. 1 is a block diagram illustrating a network services processor 100. The network services processor 100 delivers high application performance using at least one processor core 120.

The network services processor 100 processes Open System Interconnection network L2-L7 layer protocols encapsulated in received packets. As is well-known to those skilled in the art, the Open System Interconnection (OSI) reference model defines seven network protocol layers (L1-L7). The physical layer (L1) represents the actual interface, electrical and physical that connects a device to a transmission medium. The data link layer (L2) performs data framing. The network layer (L3) formats the data into packets. The transport layer (L4) handles end to end transport. The session layer (L5) manages communications between devices, for example, whether communication is half-duplex or full-duplex. The presentation layer (L6) manages data formatting and presentation, for example, syntax, control codes, special graphics and character sets. The application layer (L7) permits communication between users, for example, file transfer and electronic mail.

The network services processor 100 may schedule and queue work (packet processing operations) for upper level network protocols, for example L4-L7, and allow processing of upper level network protocols in received packets to be performed to forward packets at wire-speed. Wire-speed is the rate of data transfer of the network over which data is transmitted and received. By processing the protocols to forward the packets at wire-speed, the network services processor does not slow down the network data transfer rate.

A packet is received for processing by a plurality of interface units 122. A packet can also be received by a PCIe interface 124. The interface unit 122 performs pre-processing of the received packet by checking various fields in the L2 network protocol header included in the received packet and then forwards the packet to a packet input processing unit 126. At least one interface unit 122a can receive packets from a plurality of X Attachment Unit Interfaces (XAUI), Reduced X Attachment Unit Interfaces (RXAUI) or Serial Gigabit Media Independent Interfaces (SGMII). At least one interface unit 122b can receive connections from an Interlaken Interface (ILK).

The packet input processing unit 126 (also referred to as packet input processing and input packet data unit or PIP/IPD) performs further pre-processing of network protocol headers (e.g., L3 and L4 headers) included in the received packet. The pre-processing includes checksum checks for TCP/User Datagram Protocol (UDP) (L3 network protocols).

A free-pool allocator 128 maintains pools of pointers to free memory in Level-2 cache memory 130 and external DRAM 108. The packet input processing unit 126 uses one of the pools of pointers to store received packet data in Level-2 cache memory 130 or external DRAM 108 and another of the pools of pointers to allocate work queue entries for the processor cores 120.

The packet input processing unit 126 then writes packet data into buffers in Level-2 cache 130 or external DRAM 108. Preferably, the packet data is written into the buffers in a format convenient to higher-layer software executed in at least one of the processor cores 120. Thus, further processing of higher level network protocols is facilitated.

The network services processor 100 can also include one or more application specific co-processors. These co-processors, when included, offload some of the processing from the cores 120, thereby enabling the network services processor to achieve high-throughput packet processing. For example, a compression/decompression co-processor 132 is provided that is dedicated to performing compression and decompression of received packets. Other embodiments of co-processing units include the RAID/De-Dup Unit 162, which accelerates data striping and data duplication processing for disk-storage applications.

Another co-processor is a Hyper Finite Automata (HFA) unit 160 which includes dedicated HFA thread engines adapted to accelerate pattern and/or signature matching necessary for anti-virus, intrusion-detection systems and other content-processing applications. Using a HFA unit 160, pattern and/or signature matching is accelerated, for example being performed at rates upwards of multiples of tens of gigabits per second. The HFA unit 160, in some embodiments, could include any of a Deterministic Finite Automata (DFA), Non-deterministic Finite Automata (NFA) or HFA algorithm unit.

An I/O interface 136 manages the overall protocol and arbitration and provides coherent I/O partitioning. The I/O interface 136 includes an I/O bridge 138 and a fetch-and-add unit 140. The I/O Bridge includes two bridges, an I/O Packet Bridge (IOBP) 138a and an I/O Bus Bridge (IOBN) 138b. The I/O Packet Bridge 138a is configured to manage the overall protocol and arbitration and provide coherent I/O portioning with primarily packet input and output. The I/O Bus Bridge 138b is configured to manage the overall protocol and arbitration and provide coherent I/O portioning with primarily the I/O Bus. Registers in the fetch-and-add unit 140 are used to maintain lengths of the output queues that are used for forwarding processed packets through a packet output unit 146. The I/O bridge 138 includes buffer queues for storing information to be transferred between a coherent memory interconnect (CMI) 144, an I/O bus 142, the packet input processing unit 126 and the packet output unit 146.

The miscellaneous I/O interface (MIO) 116 can include auxiliary interfaces such as General Purpose I/O (GPIO), Flash, IEEE 802 two-wire Management Interface (MDIO), Serial Management Interrupt (SMI), Universal Asynchronous Receiver-Transmitters (UARTs), Reduced Gigabit Media Independent Interface (RGMII), Media Independent Interface (MII), two wire serial interface (TWSI) and other serial interfaces.

The network services provider 100 may also include a Joint Test Action Group ("JTAG") Interface 123 supporting the MIPS EJTAG standard. According to the JTAG and MIPS EJTAG standards, a plurality of cores within the network services provider 100 will each have an internal Test Access Port ("TAP") controller. This allows multi-core debug support of the network services provider 100.

A Schedule/Sync and Order (SSO) module 148 queues and schedules work for the processor cores 120. Work is queued by adding a work queue entry to a queue. For example, a work queue entry is added by the packet input processing unit 126 for each packet arrival. A timer unit 150 is used to schedule work for the processor cores 120.

Processor cores 120 request work from the SSO module 148. The SSO module 148 selects (i.e., schedules) work for one of the processor cores 120 and returns a pointer to the work queue entry describing the work to the processor core 120.

The processor core 120, in turn, includes instruction cache 152, Level-1 data cache 154 and crypto-acceleration 156. In one embodiment, the network services processor 100 includes 32 superscalar Reduced Instruction Set Computer (RISC)-type processor cores 120. In some embodiments, each of the superscalar RISC-type processor cores 120 includes an extension of the MIPS64 version 3 processor core. In one embodiment, each of the superscalar RISC-type processor cores 120 includes a cnMIPS II processor core.

Level-2 cache memory 130 and external DRAM 108 are shared by all of the processor cores 120 and I/O co-processor devices. Each processor core 120 is coupled to the Level-2 cache memory 130 by the CMI 144. The CMI 144 is a communication channel for all memory and I/O transactions between the processor cores 120, the I/O interface 136 and the Level-2 cache memory 130 and controller. In one embodiment, the CMI 144 is scalable to 32 processor cores 120, supporting fully-coherent Level-1 data caches 154 with write through. Preferably the CMI 144 is highly-buffered with the ability to prioritize I/O. The CMI is coupled to a trace control unit 164 configured capture bus request so software can later read the request and generate a trace of the sequence of events on the CMI.

The Level-2 cache memory controller 130 maintains memory reference coherence. It returns the latest copy of a block for every fill request, whether the block is stored in Level-2 cache memory 130, in external DRAM 108 or is "in-flight." It also stores a duplicate copy of the tags for the data cache 154 in each processor core 120. It compares the addresses of cache-block-store requests against the data-cache tags, and invalidates (both copies) a data-cache tag for a processor core 120 whenever a store instruction is from another processor core or from an I/O component via the I/O interface 136.

In some embodiments, a plurality of DRAM controllers 133 supports up to 128 gigabytes of DRAM. In one embodiment, the plurality of DRAM controllers includes four DRAM controllers, each of the DRAM controllers supporting 32 gigabytes of DRAM. Preferably, each DRAM controller 133 supports a 64-bit interface to DRAM 108. Additionally, the DRAM controller 133 can supports preferred protocols, such as the DDR-III protocol.

After a packet has been processed by the processor cores 120, the packet output unit 146 reads the packet data from the Level-2 cache memory 130, DRAM 108, performs L4 network protocol post-processing (e.g., generates a TCP/UDP checksum), forwards the packet through the interface units 122 or the PCIe interface 124 and frees the L2 cache memory 130/DRAM 108 used by the packet.

The DRAM Controllers 133 manages in-flight transactions (loads/stores) to/from the DRAM 108. In some embodiments, the DRAM Controllers 133 include four DRAM controllers, the DRAM 108 includes four DRAM memories, and each DRAM controller is connected to a DRAM memory. The DFA unit 160 is coupled directly to the DRAM Controllers 133 on a bypass-cache access path 135. The bypass-cache access path 135 allows the HFA Unit to read directly from the memory without using the Level-2 cache memory 130, which can improve efficiency for HFA operations.

Figure 2:
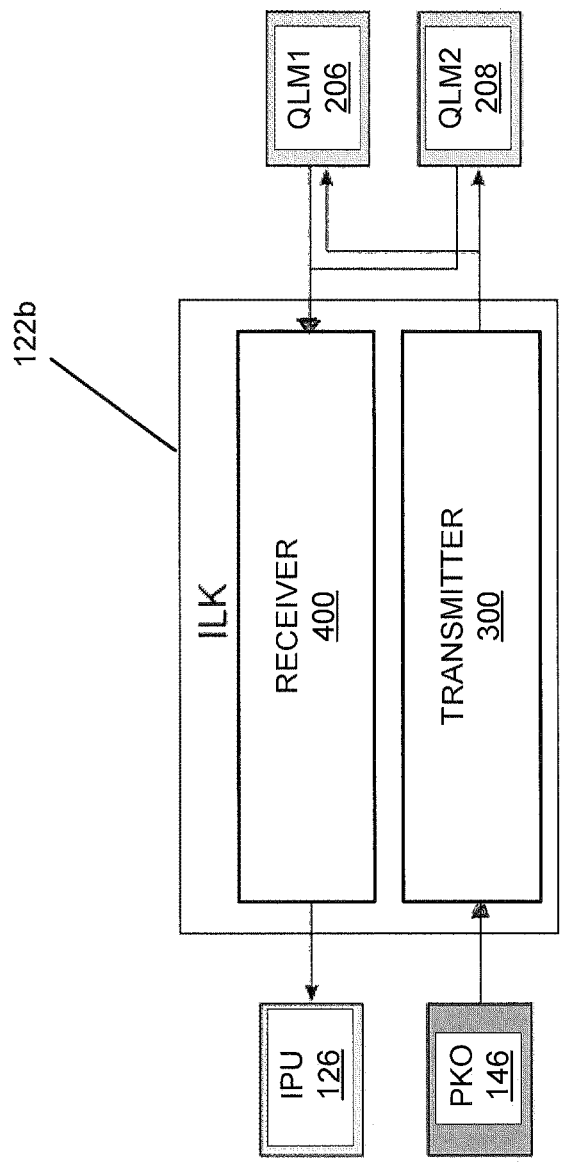
FIG. 2 illustrates an example interface unit in the processor of FIG. 1.

FIG. 2 illustrates an example interface unit 122 of processor 100. In the description of embodiments that follows, the interface unit is described in the context of the Interlaken protocol and referred to as ILK interface unit 122b.

In the embodiments described herein, the ILK interface unit 122b provides a narrow, high-speed, channelized packet interface conforming to the Interlaken Protocol Definition V1.2 and the Interlaken Look-Aside Protocol Definition V1.1.

In the Interlaken Protocol, two fundamental structures are defined: data transmission format and the metaframe. According to the data transmission format, packet data is segmented into one or more bursts. Each burst is bounded by two control words, one before and one after. Fields within the control words affect either the data burst following or preceding them for functions that include start-of-packet, end-of-packet, channelization and error detection. Each burst is associated with a logical channel. The segmenting of the data into bursts allows for the interleaving of data transmissions from different logical channels.

The metaframe is defined to include a set of four unique control words to provide lane alignment, scrambler initialization, clock compensation and diagnostic functions. The metaframe runs in-band with the data transmissions, using the control words to distinguish it from the data.

The PCIe, ILK, XAUI/RXAUI and SGMII interfaces 122, 124 (FIG. 1) may be embodied as shared SerDes interfaces. In an embodiment, the SerDes interface is made up of five quad-lane modules (QLMs) that each supports up to four serial lanes. The ILK interface unit 122b includes a receiver 400 and transmitter 300 that connect with QLM1 206 and QLM2 208. The receiver 400 receives an incoming data stream from QLM1, QLM2, processes the incoming data stream and passes the processed input data to packet input processing unit 126. The transmitter 300 receives outgoing data from packet output unit (PKO) 146, processes the outgoing data and passes the processed outgoing data to QLM1, QLM2.

Figure 3:
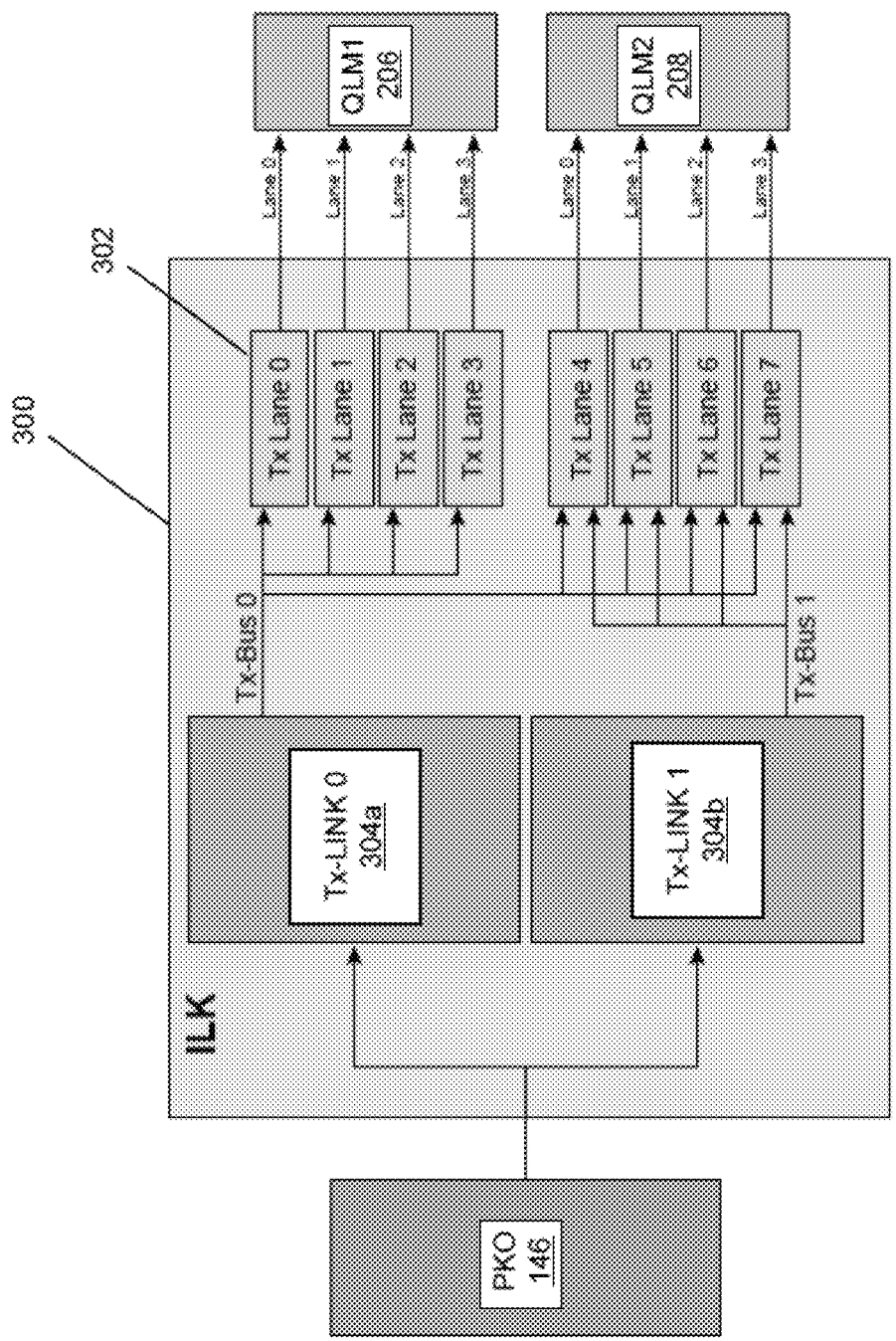
FIG. 3 illustrates an example transmitter in the interface unit of FIG. 2.

FIG. 3 is a block diagram of an example transmitter 300 in the interface unit of FIG. 2. The transmitter includes two main subunits: per-link logic (Tx-link) 304 and per-lane logic (Tx-lane) 302. In the example embodiment, there are two Tx-links and eight Tx-lanes. The ILK interface unit can bundle a single Tx-link (Tx-link0 only) to eight Tx-lanes (1×8) or the two Tx-links can split the lanes as necessary for a particular configuration (e.g. 2×4 or 1×4 and 1×2, etc.). The Tx-link is configured to implement a majority of the Interlaken protocol-layer definition, which includes burst control, flow control, CRC24 checks and striping.

The first stage of the Tx-link 304 is a transmit FIFO that stores transmit data received from PKO. The second stage unloads the transmit FIFO and inserts the burst/idle control words. Once the selected lanes are enabled, a burst/idle control function begins generating idle control words. This continues until certain conditions are met, and a new burst is started by inserting a burst-control word. Next, the appropriate number of 64-bit data words are unloaded from the transmit FIFO. Lastly, the burst needs to be closed. If the conditions to begin another burst are met, the current burst is closed with a burst-control word. Otherwise, the current burst is closed with an idle-control word and the burst/control function resumes generating idle-control words until the conditions to begin a burst are once again satisfied.

The third stage of the Tx-link performs the CRC24 calculation and updates the CRC24 of the burst/control words. In the final stage of the Tx-link, framing-control is implemented to stripe the stream of Interlaken control/data words across the enabled lanes. In addition, the framing-control function inserts the synchronization, scrambler state and diagnostic words.

The Tx-lane 302 receives 66 bits of data and a valid bit from the Tx-link 304. There are eight Tx-lanes (0-7) that transmit data to QLM1 and QLM2. Tx-lanes 0-3 transmit data to QLM1 lanes 0-3, while Tx-lanes 4-7 transmit data to QLM2 lanes 0-3. The Tx-lane is configured to implement a majority of the Interlaken framing-layer definition. This includes the metaframe CRC32 calculation, data inversion and scrambling and lane diagnostics.

The first stage of each Tx-lane 302 performs a CRC32 calculation. It is calculated over all the Interlaken words within the metaframe, except for the 64-bit/67-bit framing bits. The diagnostic words are updated with the result of the calculation. The second stage performs data inversion and scrambling as per the Interlaken protocol definition. The final stage of the Tx-lane transforms a continuous stream of 67-bit words into a continuous stream of 10-bit words. These 10-bit words are provided to the appropriate lane of the appropriate QLM.

Figure 4:
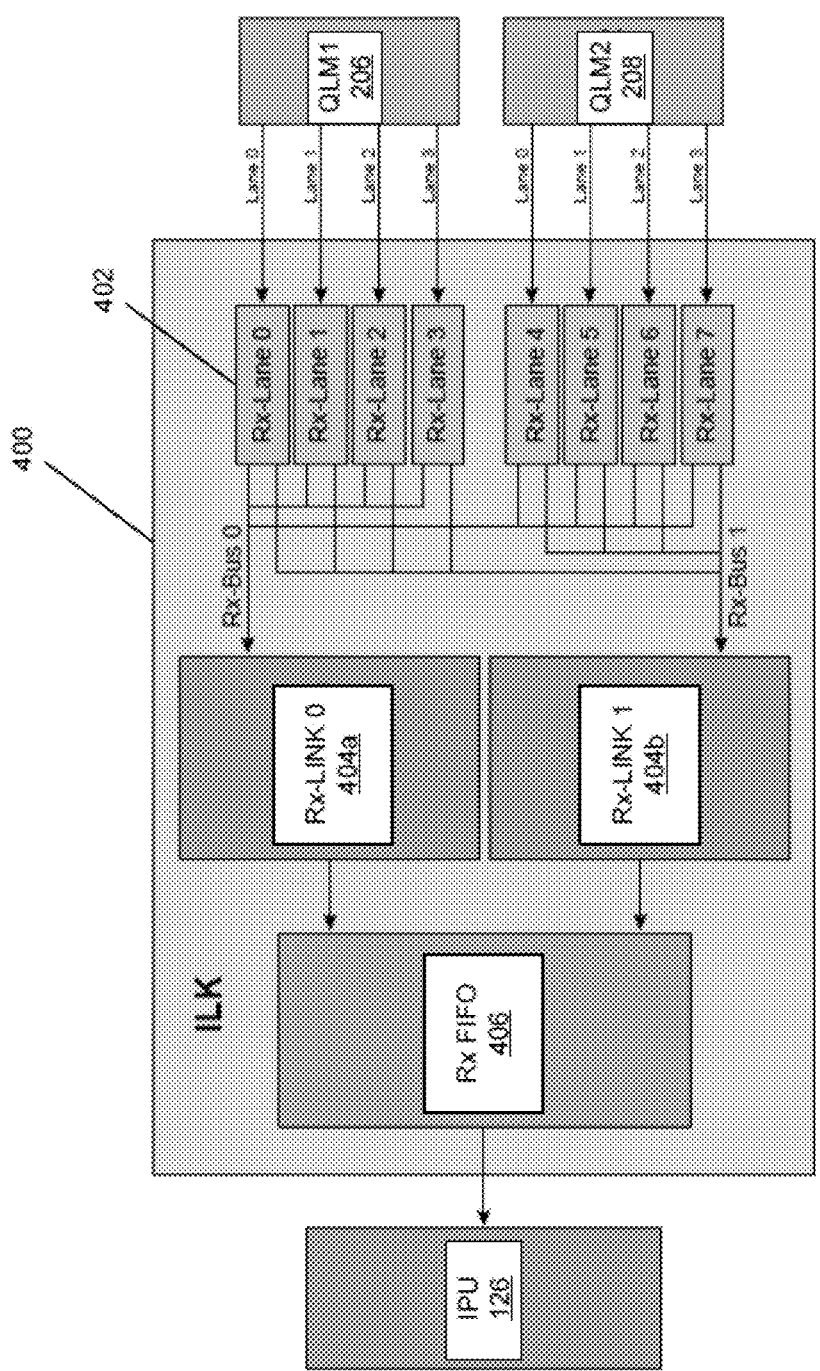
FIG. 4 illustrates an example receiver in the interface unit of FIG. 2.

FIG. 4 is a block diagram of an example receiver 400 of the interface unit of FIG. 2. The receiver 400 includes per-lane logic (Rx-lane) 402 and per-link logic (Rx-link) 404. This allows the ILK interface unit to either bundle eight Rx-lanes to a single Rx-link (1×8) or split the lanes between two Rx-links (e.g. 2×4 or 1×4 and 1×2, etc.). The receiver also includes a FIFO 406 that stores the received data until it can be delivered to the packet input processing unit 126.

There are eight Rx-lanes (0-7) that receive data from QLM1 and QLM2. Rx-lanes 0-3 receive data from QLM1 lanes 0-3 respectively, while Rx-lanes 4-7 receive data from QLM2 lanes 0-3 respectively.

Figure 5:
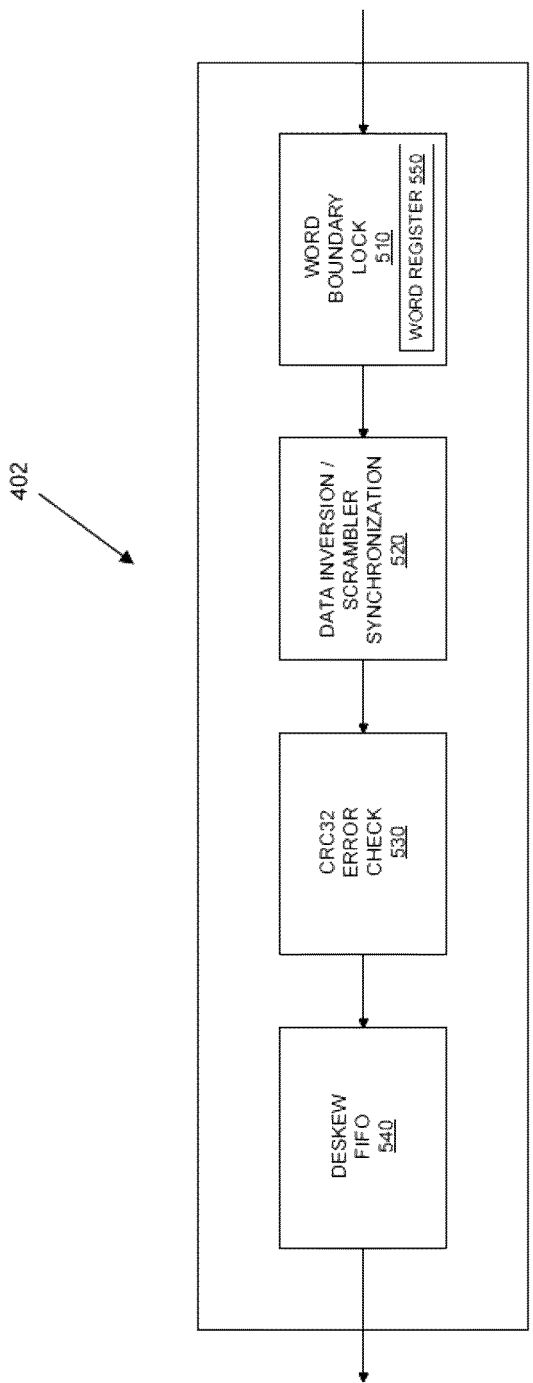
FIG. 5 is a block diagram of an example receiver lane of the receiver of FIG. 4.

FIG. 5 illustrates an example receiver lane 402 of the receiver of FIG. 4. The Rx-lane implements a majority of the Interlaken framing-layer definition. This includes the 64-bit/67-bit word-boundary lock, scrambler synchronization, data inversion and descrambling, metaframe CRC32 checks, skip-word removal and lane diagnostics.

The first stage 510 of each Rx-lane is the 64-bit/67-bit word-boundary lock. Prior to the lock being enabled, all receive data is ignored. Once the lock is enabled by software, receive data is searched for the 2-bit pattern that delineates 67-bit words as per the Interlaken protocol definition. Once word-boundary lock is achieved, 67-bit words are passed on to the next stage. Note that software may enable only the word-boundary lock on an Rx-lane that has been enabled by an Rx-link.

The second stage 520 performs data inversion and scrambler-stage synchronization as per the Interlaken protocol definition. This process is used to delineate a stream of 67-bit Interlaken words into a metaframe.

Data inversion addresses the problem of baseline wander, or DC imbalance, which may be caused by an accumulated excess of 1's or 0's transmitted on an individual SerDes lane. To account for this effect, the Interlaken protocol definition inverts the sense of the bits in each transmitted word such that the running disparity is bounded. For each lane of a bundle, a running count of the disparity is maintained: a '1' bit increments the disparity by one, and a '0' bit decrements the disparity by one. Before transmission, disparity of the current word is calculated and then compared to the current running disparity. If the current word and the existing disparity both have the same sign, then bits [63:0] within the word are inverted. A framing bit is supplied in bit position 66 so the receiver may identify whether the bits for that word are inverted. The data inversion in the second stage 520 processes the framing bit in bit position 66 accordingly and un-inverts bits [63:0] if bit position 66 indicates a data inversion.

Once scrambler-stage synchronization is achieved, the payload of received metaframes is descrambled and passed on to the next stage.

The third stage 530 performs a CRC32 check. It is calculated over all the Interlaken words within the metaframe, except for the 64-bit/67-bit framing bits. CRC32 errors are recorded for diagnostic purposes, allowing software to determine which lane is the source of interface errors.

The final stage 540 of each Rx-lane is a deskew FIFO for processed Interlaken words. The Rx-link bundles the lanes by controlling the unloading of the deskew FIFO.

Figure 6:
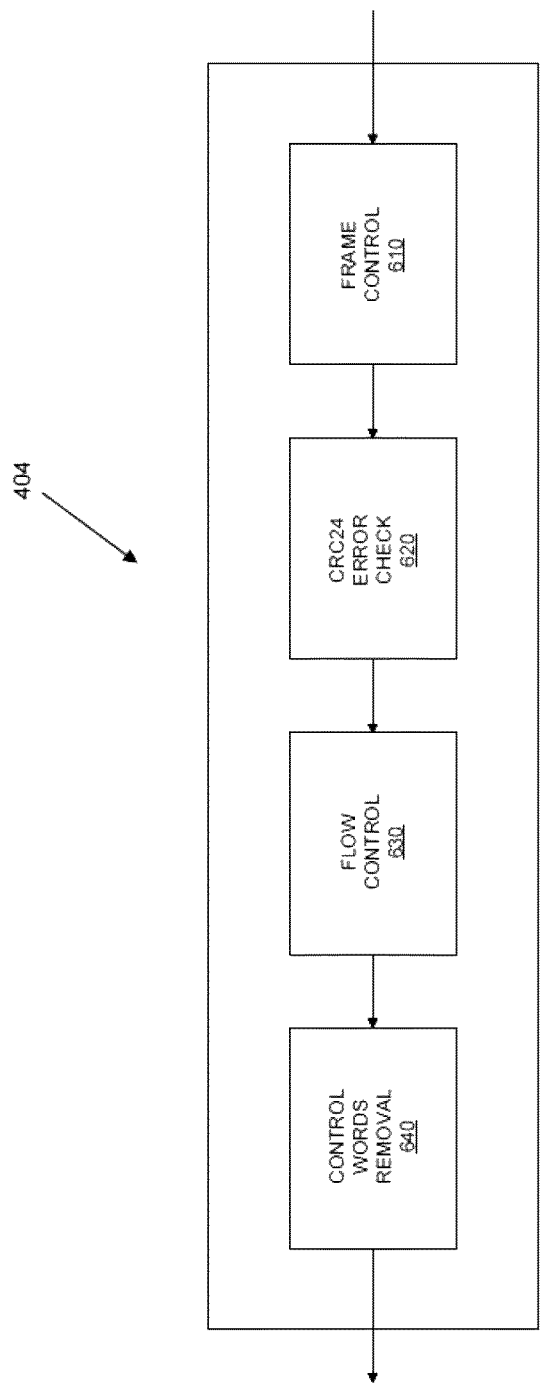
FIG. 6 is a block diagram of an example receiver link of the receiver of FIG. 4.

FIG. 6 illustrates an example receiver link 404 of the receiver of FIG. 4. There are two Rx-links connected to a bundle of Rx-lanes. Software uses lane-enable to select the Rx-lanes assigned to a given Rx-link.

The Rx-link implements part of the Interlaken framing layer, namely lane alignment. The Rx-link also implements the Interlaken protocol-layer definition, which includes destriping, CRC24 checks, burst control, tracking open channels and flow control.

The first stage 610 of the Rx-link is the frame control, which performs lane alignment and destriping in the following manner. When all enabled lanes for a given Rx-link have reached scrambler-state synchronization, software can then enable lane alignment. Prior to the lane alignment being enabled, data is drained from all enabled lanes without inspection. Once lane alignment is enabled, the Rx-link aligns the synchronization words to the front of each deskew FIFO by selectively unloading the deskew FIFO of enabled lanes. Then, once the lanes are aligned, the incoming Interlaken words are destriped by unloading one word from each lane in succession. These Interlaken words are passed on to the second stage.

The second stage 620 of the Rx-link is a CRC24 error check. The CRC24 error check covers the previous data burst (if any) and the control word containing the received CRC24. A CRC24 error causes all open packets to be forced closed with an error.

The third stage 630 of the Rx-link processes the flow-control information received in the burst/idle control words. The received flow-control status bits are mapped to ports/channels of the packet input processing unit 126. Each control word contains 16 bits located in bit positions [55:40]. Each flow-control status bit communicates XON or XOFF. By convention, XON is represented by 1 and indicates permission for transmission. XOFF is represented by 0 and indicates data should not be transmitted.

The final stage 640 removes the burst/idle control words and pushes packet data to the shared Rx FIFO 406 (FIG. 4). If the Rx FIFO is full and the packet start-of-packet (SOP) has already been pushed, the packet is truncated and marked with a truncation error. If the Rx FIFO is full and the packet SOP has not been pushed, the entire packet is dropped and a statistic counter is incremented. Pushing the packet SOP marks the channel as open. If the channel was already open, an end-of-packet (EOP) with error is pushed prior to the new SOP.

Referring again to FIG. 5, an embodiment of the receiver 400 is now described which achieves word boundary lock 510 in a time that is bounded and fixed at a minimum time required.

Prior to word lock, the receiver 400 uses a 67-bit word register 550 to accumulate data transitions instead of storing the actual received data. The 67-bit word register 550 is first initialized to all 1s. As data is serially received, the corresponding bit of the register is AND'd with the incoming data transition. This is shown below for a stream of serially received bits for the first two words of received data, but not necessarily the start of a word.

| First Word | word_reg[0] = word_reg[0] & (data 0 ^ data 1) |
| | word_reg[1] = word_reg[1] & (data 1 ^ data 2) |
| | word_reg[2] = word_reg[2] & (data 2 ^ data 3) |
| | ... |
| | word_reg[66] = word_reg[66] & (data 66 ^ data 67) |

| | |
|---|---|
| Second word | word_reg[0]= word reg[0] & (data 67 ^ data 68)<br>word_reg[1] = word_reg[1] & (data 68 ^ data 69)<br>word_reg[2] = word_reg[2] & (data 69 ^ data 70)<br>. . .<br>word_reg[66] = word_reg[66] & (data 133 ^ data 134) |

As shown in the table, processing per bit position of the 67-bit register 550 includes performing an XOR operation on a corresponding received data bit and a next received data bit, performing an AND operation on a current state of the bit position of the register and a result of the XOR operation, and storing a result of the AND operation to update the state of the bit position of the 67-bit register.

After 64 words of 67 bits, the 67-bit word register 550 will contain the cumulative transition for all bit positions for all 64 words. Any bit set indicates 64 consecutive transitions spaced by 1 word. While exactly 1 bit should be set, any bit set represents the required criteria for word lock. Therefore, word lock can be declared. All that is required is to shift the set bit by dropping the appropriate number of data bits. At this point, the 67-bit word register will begin storing the actual received data. The advantage of this approach is that the time required to achieve word boundary lock is not only bounded, but fixed at the minimum time required. In addition, the hardware requirements are minimized by reusing the 67-bit word register.

Figure 7:
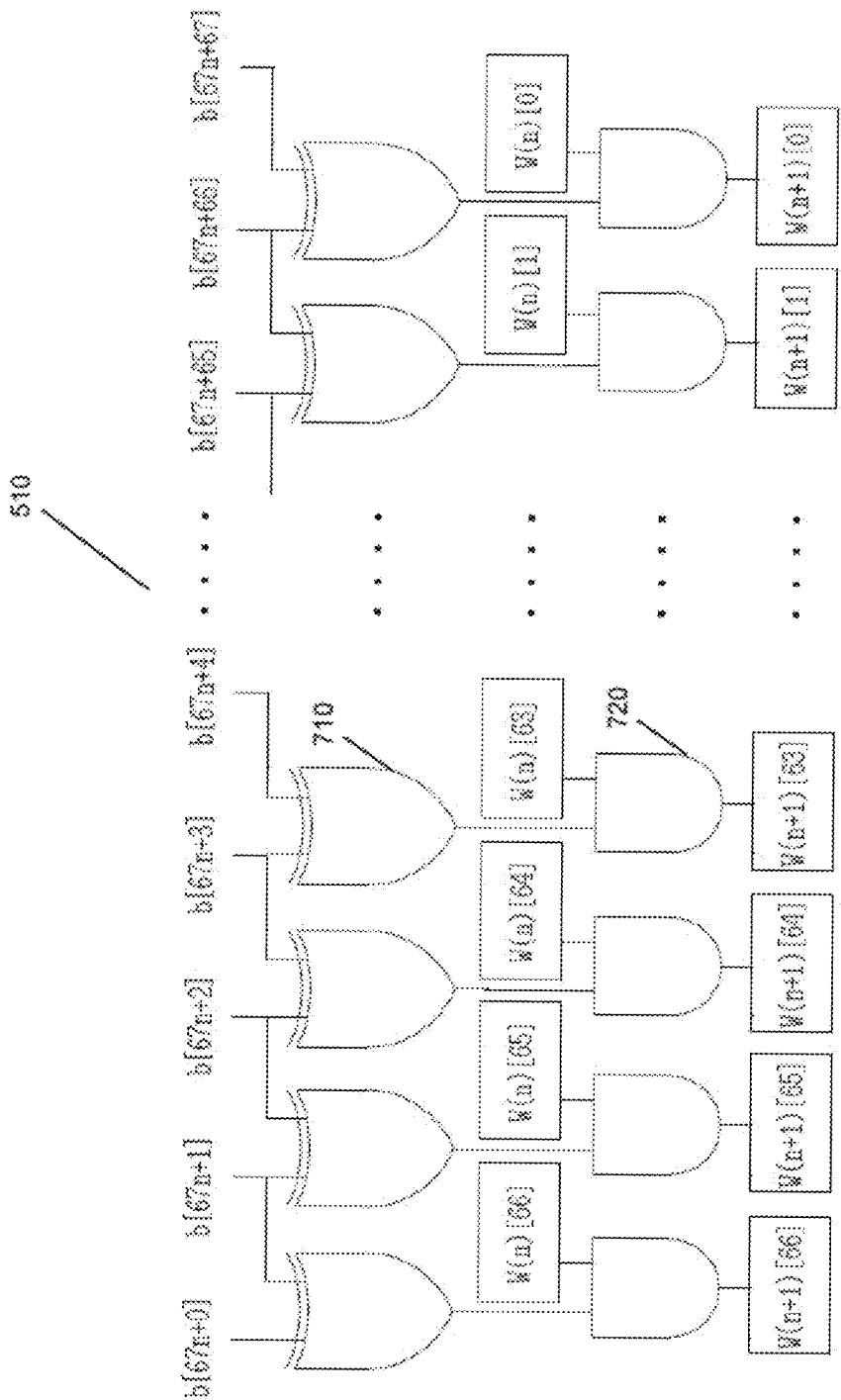
FIG. 7 illustrates example logic circuitry of the receiver lane of FIG. 5.

FIG. 7 is a circuit block diagram of example logic circuitry 510 of the receiver lane of FIG. 5 for implementing the inventive approach. In the diagram, the following are defined:

b is a stream of serially received bits where:
  b[0] is the first bit received, but not necessarily the start of a word;
  b[1] is the second bit received;
  . . . and so forth.
W is the word register 550 where:
  W(0) is the initial state of the word register and is set to all 1s;
  W(1) is the state of the word register after the first 68 bits are received;
  W(2) is the state of the word register after the next 67 bits are received;
  W(3) is the state of the word register after the next 67 bits are received;
  . . . and so forth.
W(n)[M] is Mth bit of the current state of the word register.
W(n+1)[M] is Mth bit of the next state of the word register.

In FIG. 7, for each bit position, XOR circuitry 710 performs an XOR operation on a corresponding received data bit and a next received data bit. AND circuitry 720 performs an AND operation on a current state of the bit position of the register and a result of the XOR operation. A result of the AND operation is stored to update the state of the bit position of the 67-bit register.

FIG. 7 depicts the usage of the word register prior to achieving word lock. Note that after word lock is achieved, the word register is used to accumulate a word of bits serially received. Prior to word lock, the word register can be used to accumulate a word of cumulative transitions instead of the bits themselves. Consequently, a bit W(n+1)[M] is a 1 if and only if:

$$(b[67x+((67-M)]!=b[67x+(68-M)]) \text{ for } x=(0 \ldots n)$$

A lack of a transition removes a bit position from further consideration. Due to the data scrambling, the non-framing bits are essentially random. Therefore, the word register will eventually have just a single bit set. This bit marks the bit position of the word boundary. Therefore, all further bits can be delineated into words. Any given implementation may either declare word lock once the word register has exactly one bit that is set, or continue until n=64. The latter provides a constant time for obtaining word lock, while the former locks slightly quicker.

Note that the process of computing W(n+1) can be performed 1 bit at a time, or multiple bits at a time (up to the word size). For instance, a SerDes design may partially parallelize the serial bitstream into groups of N bits prior to performing word boundary lock. In this case, N bits of W(n+1) maybe be computed per cycle using the strategy depicted in FIG. 7.

While the inventive approach shown in FIG. 7 is described in the context of 64B/67B encoding as defined in the Interlaken Protocol, the approach is also applicable to other line encoding formats such as 64B/66B encoding.

The present approach for word boundary lock significantly reduces the amount of time required to obtain word boundary lock. The maximum amount of time is bounded by (64*67)=4288UI. Additionally, an implementation which chooses to always examine 64 words will be very deterministic. In this case, the minimum amount of time is also (64*67)=4288UI. Therefore, word boundary lock is obtained in constant time, independently of the number of bit positions.

Previous methods for word boundary lock require a minimum of (64*67)=4288UI. The maximum time can be computed by assuming the worst case scenario: 66 incorrect guesses are pursed. Each bad guess may be pursed for 63 words. Therefore, the worst case is (66*63*67)=278586UI. While this may be extremely unlikely, a system would be required to tolerate such a delay. The uncertainty results from the randomness of some number of bad guesses. This leads to a longer and nondeterministic amount of time to obtain work boundary lock.

The existence of multiple receiver lanes 402 (FIG. 4) increases the problem, since all receiver lanes must obtain word boundary lock prior to the transmission of data. With the present approach, the amount of time to achieve word boundary lock across all lanes is bounded by approximately (64*67)=4288UI.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
   initializing an N bit register with initial content, where N is an integer greater than 1;
   receiving a number of consecutive N bit words of an incoming data stream;
   processing each of the number of consecutive N bit words by performing operations per bit position of the register including performing a first logic operation on a corresponding received data bit and a next received data bit, performing a second logic operation on a current state of the bit position of the register and a result of the first logic operation, and storing a result of the second logic operation to update the state of the bit position of the register; and defining a word boundary based on the content of the register following the processing of the number of consecutive N bit words.

2. The method of claim 1 wherein the content of the register following the processing of the number of consecutive N bit words indicates at least one bit set in the register representing the word boundary.

3. The method of claim 2 wherein the number of consecutive N bit words is 64 words and N equals 67.

4. The method of claim 2 wherein the number of consecutive N bit words is 64 words and N equals 66.

5. The method of claim 2 wherein the number of consecutive N bit words is that number at which exactly one bit is set in the register.

6. The method of claim 1 further comprising replacing the content of the register with subsequently received data following the defining of the word boundary.

7. The method of claim 1 wherein the method is performed in parallel on each lane of plural lanes of an Interlaken Protocol-based interface.

8. The method of claim 1 wherein the first logic operation is XOR.

9. The method of claim 1 wherein the second logic operation is AND.

10. A receiver comprising:
an N bit register initialized with initial content, where N is an integer greater than 1; and
a logic circuit coupled to the register for processing each of a number of consecutive N bit words of an incoming data stream by performing operations per bit position of the register, the logic circuit including first logic circuitry for performing a first logic operation on a corresponding received data bit and a next received data bit, and second logic circuitry for performing a second logic operation on a current state of the bit position of the register and a result of the first logic operation, a result of the second logic operation updating the state of the bit position of the register;
wherein the receiver is configured to define a word boundary in the incoming data stream based on the content of the register following the processing of the number of consecutive N bit words.

11. The receiver of claim 10 wherein the content of the register following the processing of the number of consecutive N bit words indicates at least one bit set in the register representing the word boundary.

12. The receiver of claim 11 wherein the number of consecutive N bit words is 64 words and N equals 67.

13. The receiver of claim 11 wherein the number of consecutive N bit words is 64 words and N equals 66.

14. The receiver of claim 11 wherein the number of consecutive N bit words is that number at which exactly one bit is set in the register.

15. The receiver of claim 10 wherein the receiver is further configured to replace the content of the register with subsequently received data following the defining of the word boundary.

16. The receiver of claim 10 wherein the first logic operation is XOR.

17. The receiver of claim 10 wherein the second logic operation is AND.

18. A receiver comprising:
plural lane circuits, each lane circuit comprising:
an N bit register initialized with initial content, where N is an integer greater than 1; and
a logic circuit coupled to the register for processing each of a number of consecutive N bit words of an incoming data stream by performing operations per bit position of the register, the logic circuit including first logic circuitry for performing a first logic operation on a corresponding received data bit and a next received data bit, and second logic circuitry for performing a second logic operation on a current state of the bit position of the register and a result of the first logic operation, a result of the second logic operation updating the state of the bit position of the register;
wherein for each lane circuit the receiver is configured to define a word boundary in the corresponding incoming data stream based on the content of the corresponding register following the processing of the number of consecutive N bit words.

19. The receiver of claim 18 wherein for each lane circuit, the content of the register following the processing of the number of consecutive N bit words indicates at least one bit set in the register representing the word boundary.

20. The receiver of claim 19 wherein the number of consecutive N bit words is 64 words and N equals 67.

21. The receiver of claim 19 wherein the number of consecutive N bit words is 64 words and N equals 66.

22. The receiver of claim 19 wherein the number of consecutive N bit words is that number at which exactly one bit is set in the register.

23. The receiver of claim 18 wherein for each lane circuit, the receiver is further configured to replace the content of the register with subsequently received data following the defining of the word boundary.

24. The receiver of claim 18 wherein the first logic operation is XOR.

25. The receiver of claim 18 wherein the second logic operation is AND.

* * * * *